US012642080B2

(12) United States Patent
Anderson et al.

(10) Patent No.: US 12,642,080 B2
(45) Date of Patent: May 26, 2026

(54) REDUCTION OF MIDDLE-OF-LINE RESISTANCE AND CAPACITANCE

(71) Applicant: International Business Machines Corporation, Armonk, NY (US)

(72) Inventors: Brent A. Anderson, Jericho, VT (US); Nicholas Anthony Lanzillo, Wynantskill, NY (US); Albert M. Chu, Nashua, NH (US); Ruilong Xie, Niskayuna, NY (US); Lawrence A. Clevenger, Saratoga Springs, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 372 days.

(21) Appl. No.: 18/333,863

(22) Filed: Jun. 13, 2023

(65) Prior Publication Data

US 2024/0421078 A1     Dec. 19, 2024

(51) Int. Cl.
H10W 20/41      (2026.01)
H10W 20/00      (2026.01)
H10W 20/42      (2026.01)
H10D 84/83      (2025.01)

(52) U.S. Cl.
CPC ....... H10W 20/435 (2026.01); H10W 20/056 (2026.01); H10W 20/083 (2026.01); H10W 20/42 (2026.01); H10D 84/83 (2025.01); H10W 20/033 (2026.01)

(58) Field of Classification Search
CPC ............. H10W 20/435; H10W 20/056; H10W 20/083; H10W 20/42; H10W 20/033; H10W 20/427; H10W 20/021; H10D 84/83; H10D 84/0149; H10D 84/016; H10D 84/837
See application file for complete search history.

(56) References Cited

U.S. PATENT DOCUMENTS

| | | | |
|---|---|---|---|
| 10,636,737 B2 | 4/2020 | Bao et al. | |
| 11,043,418 B2 | 6/2021 | Stephens et al. | |
| 2020/0083102 A1* | 3/2020 | Stephens | ........... H01L 21/76897 |
| 2021/0305155 A1 | 9/2021 | Bao et al. | |
| 2021/0327769 A1* | 10/2021 | Yamashita | ........... H10D 30/025 |
| 2022/0336279 A1 | 10/2022 | Lin et al. | |
| 2022/0336352 A1 | 10/2022 | Bae et al. | |
| 2022/0384243 A1 | 12/2022 | Su et al. | |

FOREIGN PATENT DOCUMENTS

EP             4068344 A1     10/2022

* cited by examiner

*Primary Examiner* — Patricia D Valenzuela
(74) *Attorney, Agent, or Firm* — Kimberly Zillig; Ryan, Mason & Lewis, LLP

(57)          ABSTRACT

A semiconductor structure includes a plurality of vertical transport field effect transistors, and an interconnect structure connected to one of respective source/drain regions of at least two vertical transport field effect transistors of the plurality of vertical transport field effect transistors and respective gate regions of the at least two vertical transport field effect transistors. The interconnect structure comprises a damascene portion, and a subtractive portion disposed on the damascene portion.

20 Claims, 8 Drawing Sheets

X-Section C

X-Section A

X-Section B

X-Section A
100

128-B
127
129
128-A1
128-A2

X-Section B
100

129
128-B
120
128-A1
112
127

127
109
128-B
129
128-A1
128-A2

127
129
120
128-B
128-A1
112

127
139
130
128-B
129
128-A1
128-A2

127
129
120
128-B
128-A1
112

X-Section C

X-Section A

X-Section B

REDUCTION OF MIDDLE-OF-LINE RESISTANCE AND CAPACITANCE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide structures that reduce middle-of-line (MOL) resistance and capacitance.

In one embodiment, a semiconductor structure includes a plurality of vertical transport field effect transistors, and an interconnect structure connected to one of respective source/drain regions of at least two vertical transport field effect transistors of the plurality of vertical transport field effect transistors and respective gate regions of the at least two vertical transport field effect transistors. The interconnect structure comprises a damascene portion, and a subtractive portion disposed on the damascene portion.

As may be combined with the preceding paragraph, the damascene portion and the subtractive portion may comprise the same metal. The subtractive portion may comprise a single metal layer, and the damascene portion may comprise a metal fill layer disposed on a liner layer. The metal fill layer may comprise the same metal as the single metal layer. The damascene portion may comprise at least one via, wherein the at least one via is connected to one of the respective source/drain regions and the respective gate regions of the at least two vertical transport field effect transistors.

As may be combined with the preceding paragraphs, the damascene portion and the subtractive portion may be continuous at one or more junctions between the damascene portion and the subtractive portion. The subtractive portion can increase in width from a top of the subtractive portion to a bottom of the subtractive portion, and the damascene portion can decrease in width from a top of the damascene portion to a bottom of the damascene portion.

As may be combined with the preceding paragraphs, a via can be disposed through the subtractive portion. Alternatively, a via is disposed on a top surface of the subtractive portion and wraps around sides of the subtractive portion. A via can be disposed on a top surface of the subtractive portion and extend beyond edges of the subtractive portion.

As may be combined with the preceding paragraphs, the respective source/drain regions may comprise top source/drain regions of the at least two vertical transport field effect transistors. The respective source/drain regions may comprise a first source/drain region having a first doping type and a second source/drain region having a second doping type different from the first doping type. A length of the damascene portion can be at least three times a width of the damascene portion, and a length of the subtractive portion can be at least three times a width of the subtractive portion.

Advantageously, by minimizing the number of via and line levels, the semiconductor structure reduces resistance and capacitance when compared to conventional structures. As an additional advantage, the via and line levels are fabricated using a dual-damascene technique plus a subtractive etching technique such that an interconnect structure comprising a damascene portion (e.g., via level) and a subtractive portion (e.g., line level) disposed on the subtractive portion is formed. The semiconductor structure reduces capacitance while maintaining long interface lengths and increased thickness for reduced resistance. For example, the semiconductor structure includes BEOL contact vias having increased contact area with contact lines, which results in less resistance.

In another embodiment, a semiconductor structure includes a plurality of vertical semiconductor channel regions, a plurality of source/drain regions, wherein respective ones of the plurality of source/drain regions are disposed on top of respective ones the plurality of vertical semiconductor channel regions, and an interconnect structure connected to the respective ones of the plurality of source/drain regions. The interconnect structure comprises a damascene portion and a subtractive portion disposed on the damascene portion.

As may be combined with the preceding paragraphs, the subtractive portion can increase in width from a top of the subtractive portion to a bottom of the subtractive portion, and the damascene portion can decrease in width from a top of the damascene portion to a bottom of the damascene portion. A via may be disposed through the subtractive portion.

In another embodiment, a method for manufacturing semiconductor structure includes forming a trench in a dielectric layer exposing respective source/drain regions of at least two vertical transport field effect transistors, forming a liner layer on side surfaces and a bottom surface of the trench, and forming a fill layer on the liner layer. The fill layer overfills the trench resulting in a first portion of the fill layer formed in the trench and a second portion of the fill layer formed out of the trench on top of the first portion. Part of the second portion of the fill layer is removed in an etching process.

As may be combined with the preceding paragraphs, a remaining part of the second portion of the fill layer may increase in width from a top to a bottom of the remaining part of the second portion.

These and other features and advantages of embodiments described herein will become more apparent from the accompanying drawings and the following detailed description.

DETAILED DESCRIPTION

Figure 1D:
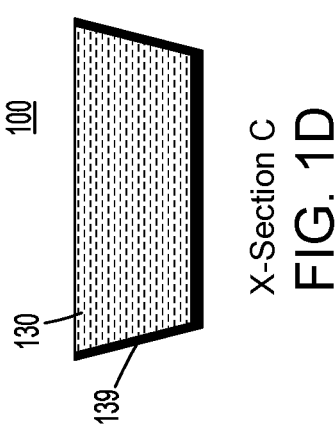
FIG. 1D is a schematic cross-sectional view taken along the line C in FIG. 1A and illustrating a contact via, according to an embodiment of the invention.
Figure 1B:
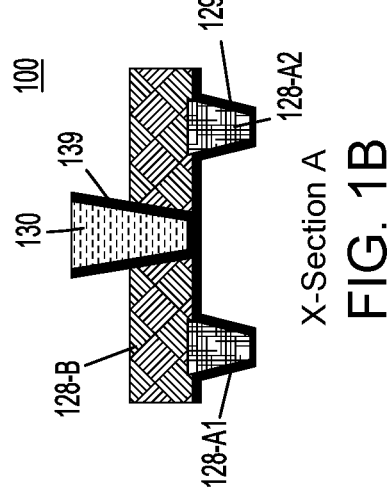
FIG. 1B is a schematic cross-sectional view taken along the line A in FIG. 1A and illustrating the semiconductor structure including contact via and contact line levels with connections to source/drain regions, according to an embodiment of the invention.
Figure 1C:
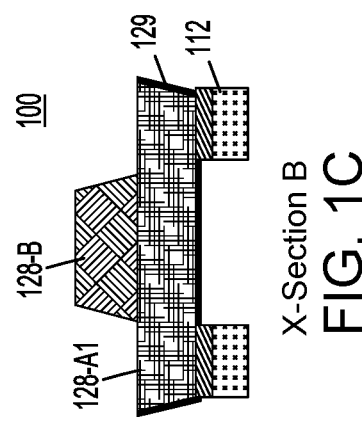
FIG. 1C is a schematic cross-sectional view taken along the line B in FIG. 1A and illustrating the semiconductor structure including contact via and contact line levels, according to an embodiment of the invention.
Figure 1A:
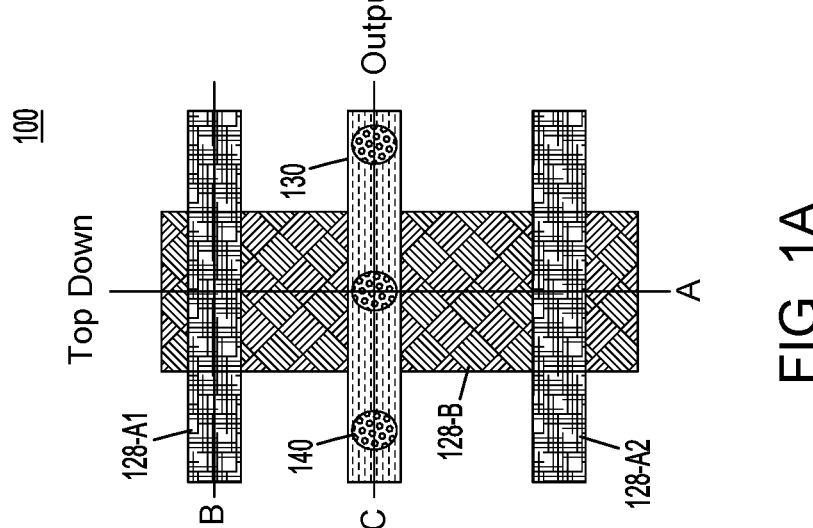
FIG. 1A is a top view illustrating a semiconductor structure including contact via and contact line levels, according to an embodiment of the invention.

Illustrative embodiments of the invention may be described herein in the context of illustrative methods for forming interconnect structures that reduce resistance and capacitance, wherein the structures are based on minimizing the number of via and line levels, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers may be used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Vertical transport field effect transistors (VTFETs) are viable device options for scaling semiconductor devices (e.g., CMOS devices) to a 7 nanometer (nm) node and beyond. VTFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves selectively removing sacrificial layers, which may be formed of silicon germanium (SiGe), between sheets of channel material, which may be formed of silicon (Si).

For continued scaling (e.g., to 2.5 nm and beyond), next-generation complementary FET (CFET) devices may be used. CFET devices provide a complex gate-all-around (GAA) structure. Conventional GAA FETs, such as nanosheet FETs, may stack multiple p-type nanowires or nanosheets on top of each other in one device, and may stack multiple n-type nanowires or nanosheets on top of each other in another device. CFET structures provide improved track height scaling, leading to structural gains (e.g., such as 30-40% structural gains for different types of devices, such as logic devices, static random-access memory (SRAM) devices, etc.). In CFET structures, n-type and p-type nanowires or nanosheets are stacked on each other, eliminating n-to-p separation bottlenecks and reducing the device area footprint. There is, however, a continued desire for further scaling and reducing the size of FETs.

As discussed above, various techniques may be used to reduce the size of FETs, including through the use of fin-shaped channels in FinFET devices and VTFET devices, through the use of stacked nanosheet channels formed over a semiconductor substrate, and next-generation CFET devices.

Although embodiments of the present invention are discussed in connection with VTFETs, the embodiments of the present invention are not necessarily limited thereto, and may similarly apply to other types of transistor devices.

Figure 2:
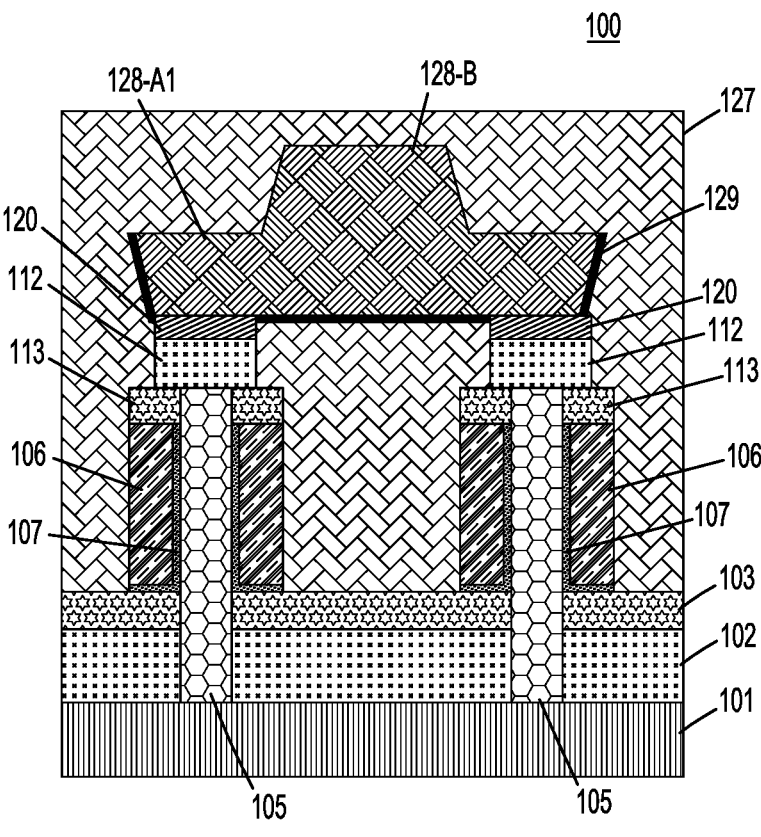
FIG. 2 is a schematic cross-sectional view illustrating the semiconductor structure with connections to top source/drain regions of vertical transport field effect transistors (VTFETs), according to an embodiment of the invention.

Referring to FIGS. 1A-1D and to FIG. 2, in an illustrative embodiment, a semiconductor structure 100 includes contact via and contact line levels with connections to top source/drain regions 112 of VTFETs. A semiconductor substrate 101 includes semiconductor material including, but not limited to, silicon (Si), silicon germanium (SiGe), silicon carbide (SIC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 105, can be formed by patterning a semiconductor layer into the fins 105. The semiconductor layer can include, but is not necessarily limited to, Si, SiGe or III-V materials, and may be epitaxially grown. According to an embodiment, a hardmask including, for example, a dielectric material, such as silicon nitride (SiN) is formed on portions of the semiconductor layer that are to be formed into the fins 105. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited to, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. In addition, although two fins 105 are shown in FIG. 2 for ease of explanation, more or less than two fins can be formed.

A bottom source/drain region 102 is formed around the fins 105. The bottom source/drain region 102 can be formed by a bottom-up epitaxial growth process (with optional dummy vertical dielectric liners covering fin sidewalls during epitaxial growth), wherein the bottom source/drain region 102 is grown in an epitaxial process to a certain height (thickness) such as, but not necessarily limited to about 10 nm to about 50 nm. The epitaxially grown bottom source/drain region 102 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (TI) at various concentrations. For example, in a non-limiting example, a dopant concentration range may be $1\times10^{18}/cm^3$ to $1\times10^{21}/cm^3$.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a metal-organic chemical vapor deposition (MOCVD), rapid thermal chemical vapor deposition (RT-CVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

Referring further to FIG. 2, a bottom spacer layer 103 is formed on the bottom source/drain region 102. The bottom spacer layer 103 includes, but is not necessarily limited to, silicon boron nitride (SiBN), siliconborocarbonitride (SiBCN), silicon oxycarbonitride (SiOCN), SiN or silicon oxide ($SiO_x$), where x is, for example, 2 in the case of silicon dioxide ($SiO_2$), or 1.99 or 2.01. According to an embodiment of the present invention, the bottom spacer layer 103 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Alternatively, the spacer material can be deposited using conformal deposition techniques, and removed from vertical surfaces using directional removal techniques, such as, for example, RIE. Spacer material formed on hardmasks on top of the fins 105 can be removed using a planarization process, such as, for example, chemical mechanical planarization (CMP).

Gate regions 106 including, for example, one or more gate metal layers and work function metal (WFM) layers, are formed on gate dielectric layers 107. The gate dielectric layers 107 include, for example, a high-k material including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide). The WFM layers and gate dielectric layers 107 are conformally deposited on the bottom spacer layer 103 and on and around the fins 105 including hardmasks thereon.

The WFM layers are deposited on the gate dielectric layers 107 and include, for example, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN.

The gate metal layers are deposited on the WFM layers and include, for example, a low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate metal layers and WFM layers of the gate regions 106 and gate dielectric layers 107 are deposited using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), sputtering and/or plating. An isotropic etch is performed to recess the gate structures, including the gate regions 106 and gate dielectric layers 107.

Top spacer layers 113 are formed on the recessed gate structures, including the gate regions 106 and gate dielectric layers 107, and on and around the fins 105. The top spacer layers 113 include, for example, SiN, SiBN, SiBCN, SiOCN or other dielectric. According to an embodiment of the present invention, the top spacer layers 113 are conformally deposited using, for example, deposition techniques including, but not limited to, CVD, PECVD, RFCVD, PVD, ALD, MLD, MBD, PLD, LSMCD, sputtering, and/or plating.

A dielectric material, including, but not limited to $SiO_x$, low temperature oxide (LTO), high temperature oxide (HTO), flowable oxide (FOX) or some other dielectric, is deposited to form an inter-layer dielectric (ILD) layer 127 on and around the recessed gate structures, including the top spacer layers 113 thereon and on the bottom spacer layer 103. The ILD layer 127 can be deposited using deposition techniques including, but not limited to, CVD, PECVD, RFCVD, PVD, ALD, MLD, MBD, PLD, and/or LSMCD, sputtering, and/or plating. Planarization, for example, CMP can be performed to remove excess ILD material and planarize the resulting structure. The planarization can be performed down to the hardmasks on the fins 105.

The hardmasks are selectively removed, using for example, a selective etch process. The selective etch process can include, for example, fluorinated gas (such as $SF_6$, $CH_4$, or $CHF_3$) based dry etching or hot phosphoric acid ($H_3PO_4$)

etching. Then, upper portions of the ILD layer 127 are removed using, for example, another selective etching process, such as a selective oxide etch using, for example, F/NH₃ based dry etching. The removal of the upper portions of the ILD layer 127 exposes upper portions of the fins 105 so that top source/drain regions 112 can be epitaxially grown.

The top source/drain regions 112 are epitaxially grown in an epitaxial growth process from the upper portions of the fins 105. The epitaxially grown top source/drain regions 112 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of P, As and Sb, and a p-type dopant selected from a group of B, Ga, In, and Tl at various concentrations. For example, in a non-limiting example, a dopant concentration range may be $1\times10^{18}/cm^3$ to $1\times10^{21}/cm^3$.

Following formation of the top source/drain regions 112, ILD material is again deposited to form the remainder of the ILD layer 127 over the top source/drain regions 112 and to fill in gaps between the top source/drain regions 112. The ILD material is deposited using, for example, deposition techniques including, but not limited to, CVD, PECVD, RFCVD, PVD, ALD, MLD, MBD. PLD, LSMCD, sputtering, and/or plating, followed by a planarization process, such as, for example, CMP.

Figure 3A:
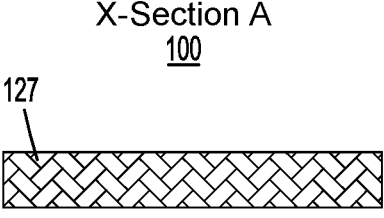
FIGS. 3A and 3B are schematic cross-sectional views corresponding to lines A and B in FIG. 1A, respectively and illustrating top source/drain regions and a dielectric layer in connection with processing to form contact via and contact line levels, according to an embodiment of the invention.
Figure 3B:
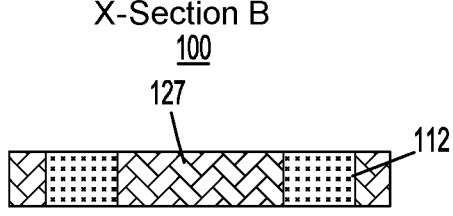
Figure 3C:
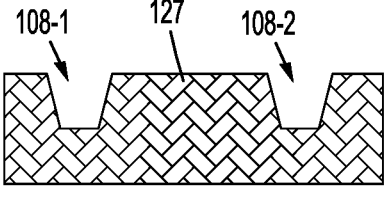
FIGS. 3C and 3D are schematic cross-sectional views corresponding to lines A and B in FIG. 1A, respectively and illustrating dielectric deposition and removal to form via openings in connection with processing to form contact via and contact line levels, according to an embodiment of the invention.
Figure 3D:
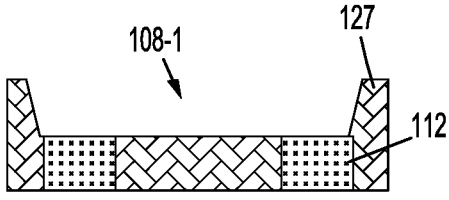

FIGS. 3A and 3B illustrate top source/drain regions 112 and a portion of the ILD layer 127 in connection with processing to form contact via and contact line levels in semiconductor structure 100. FIGS. 3C and 3D illustrate addition deposition of dielectric material for the ILD layer 127 and removal of portions of the ILD layer 127 to form via openings 108-1 and 108-2 in connection with forming a contact via level. Referring to the cross-section corresponding to line B in FIG. 1A, the via opening 108-1 exposes the two top source/drain regions 112 also shown in FIG. 1C and FIG. 2. The via openings 108-1 and 108-2 (also referred to herein as "trenches") are opened in the ILD layer 127 using, for example, lithography followed by RIE.

Figure 3E:
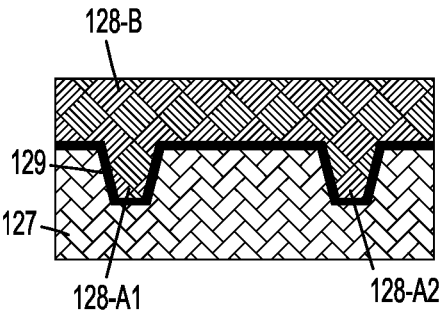
FIGS. 3E and 3F are schematic cross-sectional views corresponding to lines A and B in FIG. 1A, respectively and illustrating metal liner and metal deposition in connection with processing to form contact via and contact line levels, according to an embodiment of the invention.
Figure 3F:
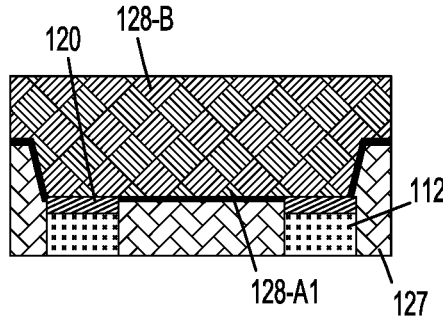
Figure 3G:
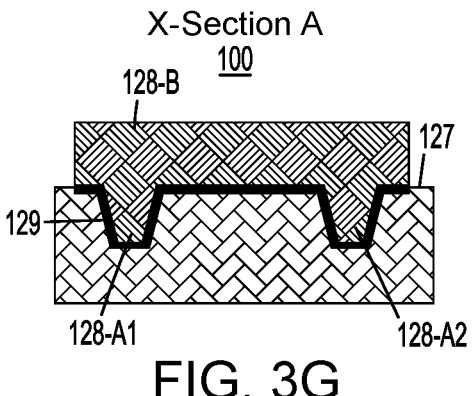
FIGS. 3G and 3H are schematic cross-sectional views corresponding to lines A and B in FIG. 1A, respectively and illustrating subtractive metal etching in connection with processing to form contact via and contact line levels, according to an embodiment of the invention.
Figure 3H:
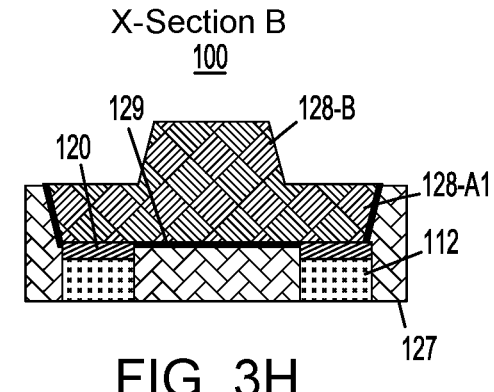

FIGS. 3E and 3F illustrate metal liner and metal deposition to form contact via and contact line levels. In more detail, in a damascene process, a contact via level comprising vias 128-A1 and 128-A2 is formed by lining the side and bottom surfaces of the via openings 108-1 and 108-2 and a top surface of the ILD layer 127 with a liner layer 129 (e.g., titanium nitride (TiN), tantalum nitride (TaN), etc.). A remaining portion of the via openings 108-1 and 108-2 is filled with metal material, such as, for example, but not necessarily limited to, tungsten, cobalt, zirconium, tantalum, titanium, aluminum, ruthenium, and/or copper to form the vias 128-A1 and 128-A2. Vias 128-A1 and 128-A2 may each be referred to herein as a "damascene portion" of an interconnect structure. In illustrative embodiments the via openings 108-1 and 108-2 are overfilled to form the contact line level comprising contact line 128-B. According to illustrative embodiments, as a result of the overfilling, the contact line 128-B comprises the same material as the metal material deposited on the liner layer 129, and the contact line 128-B is continuous with the underlying vias 128-A1 and 128-A2 at junctions between the contact line 128-B and the underlying vias 128-A1 and 128-A2 since the contact line 128-B and underlying vias 128-A1 and 128-A2 are formed from the same metal material. In FIGS. 1A-1C and 2, although the contact line 128-B and underlying vias 128-A1 and 128-A2 comprise the same metal material, they are depicted with different patterns to illustrate the positional difference between the contact line 128-B and underlying vias 128-A1 and 128-A2. In addition, as can be seen in, for example, FIGS. 1B, 1C, 2, 3E and 3F, in illustrative embodiments, the contact line 128-B comprises a single (e.g., one) metal. For example, the contact line 128-B comprises a metal material, such as, but not necessarily limited to, tungsten, cobalt, zirconium, tantalum, titanium, aluminum, ruthenium or copper.

In an alternative embodiment, the contact line 128-B and underlying vias 128-A1 and 128-A2 may comprise different metal materials from each other. Deposition of the liner layer 129 and metal material layer of the contact line 128-B and underlying vias 128-A1 and 128-A2 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

A silicide layer 120 may optionally be formed on the portions of the top source/drain regions 112 by, for example, silicidation (e.g., formation of an alloy including a portion of a contact material with silicon in an underlying semiconductor layer) before filling the via openings 108-1 and 108-2 over the top source/drain regions 112 with the liner layer 129 or the metal material. More specifically, a metal layer including a material capable of forming a silicide is deposited on the exposed portions of the top source/drain regions 112 after trench formation. The material can include, but is not necessarily limited to, metals such as cobalt, nickel, platinum, titanium, tantalum and tungsten, or combinations thereof. The material preferably is thermally stable, being able to remain stable under high temperatures due to subsequent steps performed under high temperature conditions.

A process, such as, for example, an annealing process at approximately 300° C. to approximately 450° C., is performed so that the metal layer reacts with silicon in the top source/drain regions 112 to convert a portion of the top source/drain regions 112 into silicide layer 120. The annealing process is not necessarily limited to the temperature range above, and may be performed at other temperatures if required. The silicide layer 120 may include, but is not necessarily limited to, cobalt silicide ($CoSi_x$), tungsten silicide ($WSi_x$), nickel silicide (NiSi), nickel platinum silicide ($NiPt_ySi_x$), tantalum silicide ($TaSi_x$), titanium silicide ($TiSi_x$) and combinations thereof.

Referring to FIGS. 1B, 1D, 3G and 3H, following, for example, overfilling of the metal material, a subtractive metal etch process removes side portions of the contact line 128-B, such that the contact line 128-B is formed in a damascene plus subtractive process. As noted herein above, vias 128-A1 and 128-A2 may each be referred to herein as a "damascene portion" of an interconnect structure. The contact line 128-B may be referred to herein as a "subtractive portion" of the interconnect structure. As can be seen in FIGS. 1C, 2, 3H, 3J and 3L, as a result of the subtractive process, the contact line 128-B increases in width from a top of the contact line 128-B to a bottom of the contact line 128-B. In other words, the contact line 128-B tapers outward from a top portion to a bottom portion. In contrast, the underlying vias 128-A1 and 128-A2 decrease in width from a top portion of the vias 128-A1 and 128-A2 to a bottom portion of the vias 128-A1 and 128-A2. The subtractive etching process is performed using, for example, an $O_2$-based direct etch chemistry with $O_2/Cl_2$ and $O_2/F_2$ as some example combinations, while masking portions of the contact line 128-B that is not to be etched.

Figure 3I:
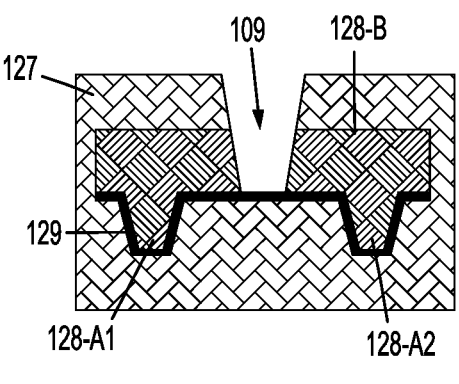
FIGS. 3I and 3J are schematic cross-sectional views corresponding to lines A and B in FIG. 1A, respectively and illustrating dielectric deposition and dielectric and metal removal to form a via opening in connection with processing to form contact via and contact line levels, according to an embodiment of the invention.
Figure 3J:
Figure 3K:
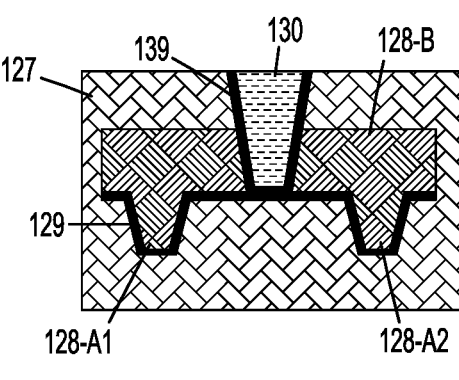
FIGS. 3K and 3L are schematic cross-sectional views corresponding to lines A and B in FIG. 1A, respectively and illustrating metal liner and metal deposition to form a contact via in connection with processing to form contact via and contact line levels, according to an embodiment of the invention.
Figure 3L:
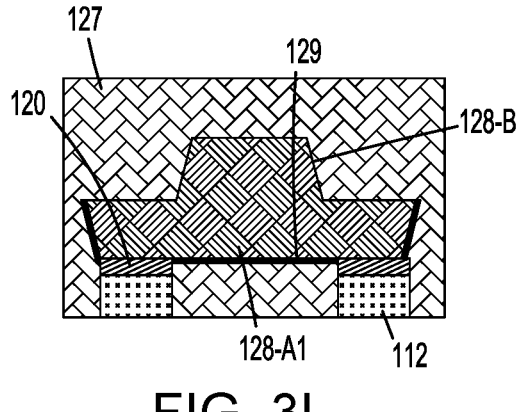
Figure 4D:
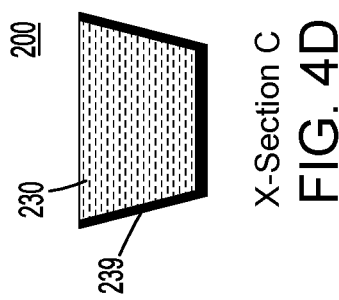
FIG. 4D is a schematic cross-sectional view taken along the line C in FIG. 4A and illustrating a contact via, according to an embodiment of the invention.
Figure 4B:
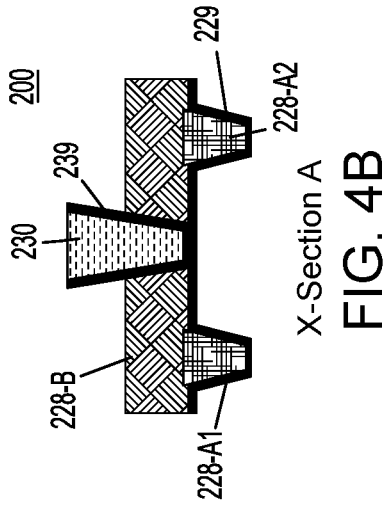
FIG. 4B is a schematic cross-sectional view taken along the line A in FIG. 4A and illustrating the semiconductor structure including contact via and contact line levels with connections to source/drain regions, according to an embodiment of the invention.
Figure 4C:
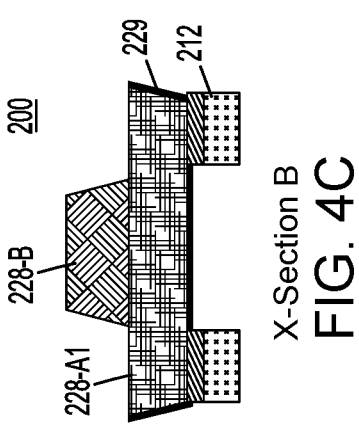
FIG. 4C is a schematic cross-sectional view taken along the line B in FIG. 4A and illustrating the semiconductor structure including contact via and contact line levels, according to an embodiment of the invention.
Figure 4A:
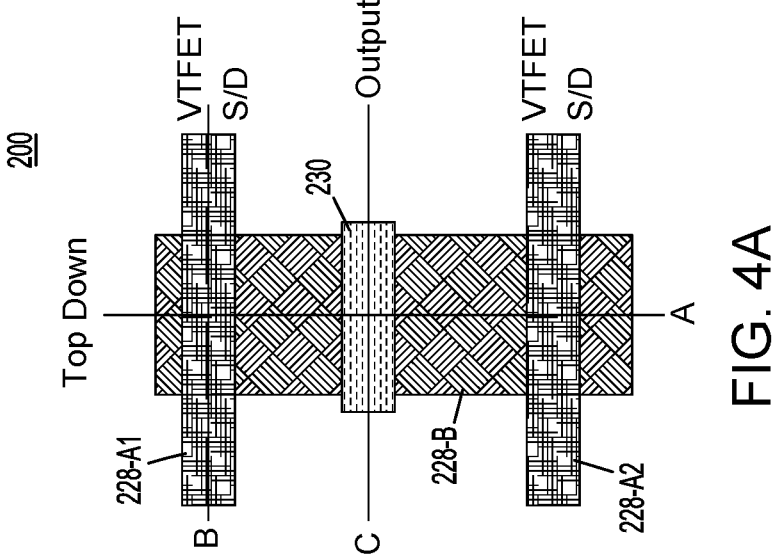
FIG. 4A is a top view illustrating a semiconductor structure including contact via and contact line levels, according to an embodiment of the invention.

FIGS. 3I and 3J illustrate additional dielectric material deposition (dielectric backfill) to fill in areas around and on top of the contact line 128-B and increase the height of the ILD layer 127. Following the additional dielectric material deposition, a via opening 109 is formed by etching a portion of the ILD layer 127 over a portion of the contact line 128-B in a first etching process and then etching through the portion of the contact line 128-B in a second etching process to expose the underlying liner layer 129. The first and second etching processes are performed using, for example, an $O_2$-based direct etch chemistry with $O_2/Cl_2$ and $O_2/F_2$ as some example combinations, while masking portions of the ILD layer 127 that are not to be etched.

Referring to FIGS. 1A, 1B, 1D and 3K and 3L a liner layer 139 and metal material are deposited to form a back-end-of-line (BEOL) contact via 130 through the contact line 128-B. In illustrative embodiments, the contact line 128-B and the contact vias 128-A1 and 128-A2 are an MOL contact line and MOL contact vias. In illustrative embodiments, the side and bottom surfaces of the via opening 109 and a top surface of the ILD layer 127 are lined with the liner layer 139 (e.g., TiN, TaN, etc.). A remaining portion of the via opening 109 is filled with metal material, such as, for example, but not necessarily limited to, tungsten, cobalt, zirconium, tantalum, titanium, aluminum, ruthenium, and/or copper to form the BEOL contact via 130. Deposition of the liner layer 139 and metal material layer of the BEOL contact via 130 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP to remove excess liner layer and metal material from a top surface of the ILD layer 127. Similar to the vias 128-A1 and 128-A2, the BEOL contact via 130 decreases in width from a top portion of the BEOL contact via 130 to a bottom portion of the BEOL contact via 130. In this embodiment, the BEOL contact via 130 is formed through the contact line 128-B from on top of the contact line 128-B through a top surface of the contact line 128-B, through a middle portion of the contact line 128-B and through a bottom surface of the contact line 128-B to contact the underlying liner layer 129.

Figures 6A, 6B, 6C:
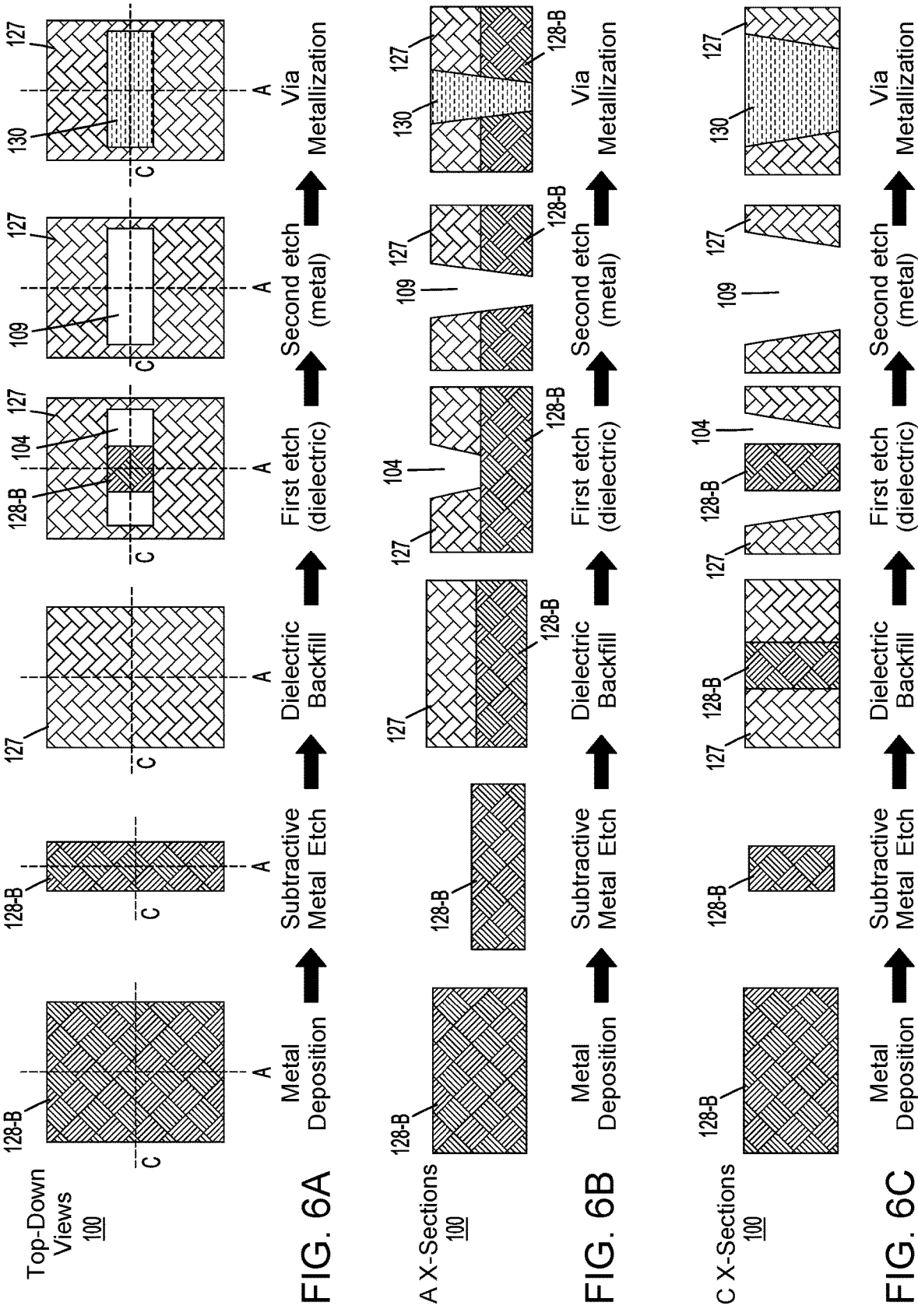
FIG. 6A depicts top-down views illustrating subtractive metal etching, dielectric deposition, dielectric and metal layer etching to form a via opening and metal deposition to form a via through a contact line, according to an embodiment of the invention.
FIG. 6B depicts schematic cross-sectional views taken along the lines A in FIG. 6A and illustrating subtractive metal etching, dielectric deposition, dielectric and metal layer etching to form a via opening and metal deposition to form a via through a contact line, according to an embodiment of the invention.
FIG. 6C depicts schematic cross-sectional views taken along the lines C in FIG. 6A and illustrating subtractive metal etching, dielectric deposition, dielectric and metal layer etching to form a via opening and metal deposition to form a via through a contact line, according to an embodiment of the invention.
Figure 7B:
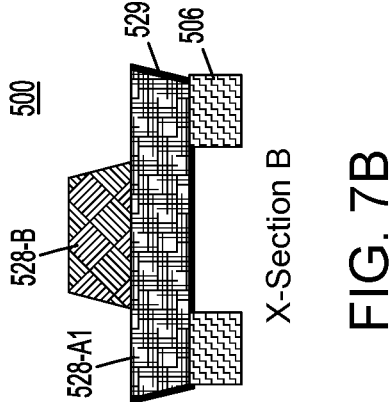
FIG. 7B is a schematic cross-sectional view taken along the line B in FIG. 7A and illustrating the semiconductor structure including contact via and contact line levels with connections to gate regions, according to an embodiment of the invention.
Figure 7A:
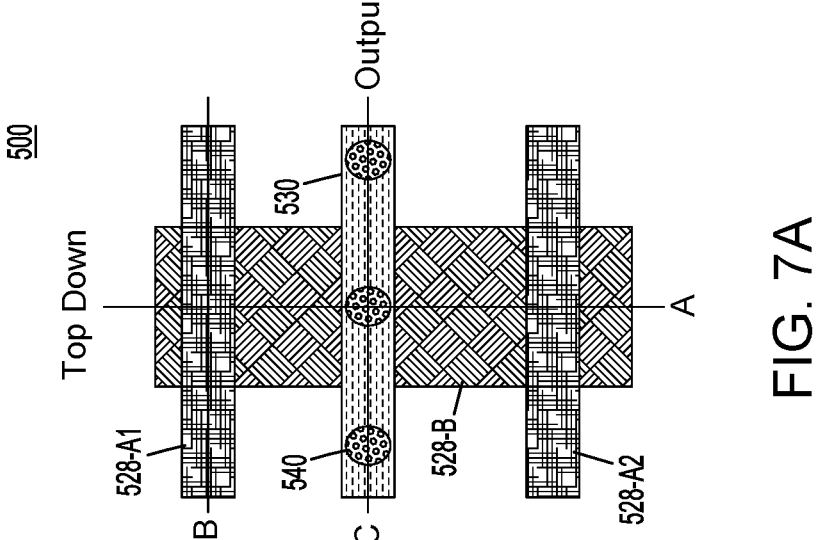
FIG. 7A is a top view illustrating a semiconductor structure including contact via and contact line levels, according to an embodiment of the invention.

In accordance with descriptions corresponding to FIGS. 3E-3L, FIGS. 6A-6C depict top-down and corresponding cross-sectional views of portions of the semiconductor structure 100 to illustrate the metal deposition and subtractive metal etching of the contact line 128-B, deposition and backfilling of the ILD layer 127, etching of the ILD layer 127 and portion of the contact line 128-B to form the via opening 109 and metal deposition to form the BEOL contact via 130 via through the contact line 128-B. As can be seen in FIGS. 6A-6C, a first etch of the ILD layer 127 forms an opening 104 and the second etch of the underlying portion of the contact line 128-B exposed by the opening 104 results in the via opening 109.

Comparing FIGS. 1A-1D to FIGS. 4A-4D, the dimensions of the BEOL contact via can vary. For example, in the semiconductor structure 100 in FIGS. 1A-1D, the length of the BEOL contact via 130 (left to right direction in FIGS. 1A and 1D) is larger than the length of the BEOL contact via 230 (left to right direction in FIGS. 4A and 4D) of the semiconductor structure 200. The larger length of the BEOL contact via 130 permits a larger number of possible contact points 140 from overlying lines and/or more options for placement and spacing of the contact points 140 than on the BEOL contact via 230. Referring to the top-down views in FIGS. 1A and 4A, both the BEOL contact via 130 and the BEOL contact via 230 have lengths such that the BEOL contact via 130 and the BEOL contact via 230 extending beyond left and right edges of the contact line 128-B. In other respects, the semiconductor structures 100 and 200 are the same or similar, and similar reference numerals in addition to reference numeral 230 (e.g., 212, 228-A1, 228-A2, 228-B, 229 and 239) have been used to designate the same or similar elements. In illustrative embodiments, lengths of the vias 128-A1/228-A1, 128-A2/228-A2 (left to right direction in FIGS. 1A, 1C, 4A and 4C) are at least three times widths of the vias 128-A1/228-A1, 128A2/228-A2 (up and down direction in FIGS. 1A, 1C, 4A and 4C). In some embodiments, the length of the BEOL contact via (e.g., BEOL contact via 130) (left to right direction in FIGS. 1A and 1D) is at least three times the width of the BEOL contact via (up and down direction in FIGS. 1A and 1D). In illustrative embodiments, lengths of the contact lines 128-B/228-B (up and down direction in FIGS. 1A and 4A) are at least three times widths of the contact lines 128-B/228-B (left to right direction in FIGS. 1A and 4A).

Figures 5A, 5B, 5C:
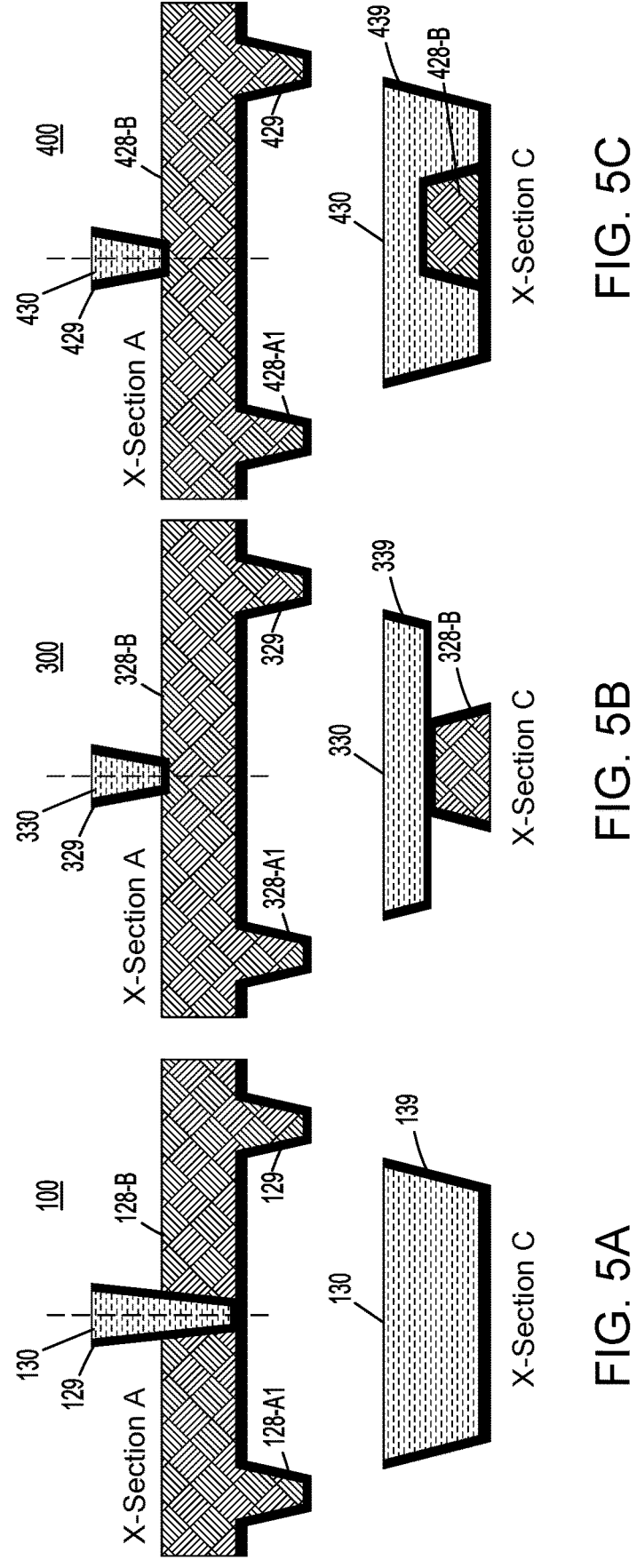
FIG. 5A depicts schematic cross-sectional views taken along the lines A and C in FIG. 1A and illustrating a semiconductor structure with a via through a contact line, according to an embodiment of the invention.
FIG. 5B depicts schematic cross-sectional views corresponding to the lines A and C in FIG. 1A and illustrating a semiconductor structure with a via on top of a contact line, according to an embodiment of the invention.
FIG. 5C depicts schematic cross-sectional views corresponding to the lines A and C in FIG. 1A and illustrating a semiconductor structure with a via wrapped around sides of a contact line, according to an embodiment of the invention.

In illustrative embodiments, the structure of the BEOL contact via may vary. For example, FIG. 5A depicts schematic cross-sectional views illustrating the semiconductor structure 100 where the BEOL contact via 130 is disposed through the contact line 128-B as described herein above. In another example, FIG. 5B depicts schematic cross-sectional views illustrating a semiconductor structure 300 with a BEOL contact via 330 on top of a contact line 328-B. In the semiconductor structure 300, an entirety of the BEOL contact via 330 is disposed on and contacts a top surface of the contact line 328-B. Similar to the BEOL contact via 130, the BEOL contact via 330 includes a liner layer 339 like the liner layer 139 and a metal material layer filling in a remaining portion of the BEOL contact via 330. The semiconductor structure 300 is the same or similar to the semiconductor structure 100 in other respects. For example, the semiconductor structure 300 includes an MOL contact via level comprising contact vias 328-A1 and 328-A2 with liner layer 329 similar to the MOL contact via level comprising contact vias 128-A1 and 128-A2 with liner layer 129.

In another example, FIG. 5C depicts schematic cross-sectional views illustrating a semiconductor structure 400 with a BEOL contact via 430 wrapped around sides of a contact line 428-B. In the semiconductor structure 400, part of the BEOL contact via 430 is disposed on and contacts a top surface of the contact line 428-B, while another part of BEOL contact via 430 extends outward (left and right directions in cross-section C) and the downward direction in cross-section C to surround left and right sides of the contact line 428-B. As can be seen in cross-section C, the BEOL contact via 430 covers three sides (top, left and right sides) of the contact line 428-B. Unlike the BEOL contact via 130, the BEOL contact via 430 is not formed through the contact line 428-B. Similar to the BEOL contact via 130, the BEOL contact via 430 includes a liner layer 439 like the liner layer 139 and a metal material layer filling in a remaining portion of the BEOL contact via 430. The semiconductor structure 400 is the same or similar to the semiconductor structure 100 in other respects. For example, the semiconductor structure 400 includes an MOL contact via level comprising contact vias 428-A1 and 428-A2 with liner layer 429 similar to the MOL contact via level comprising contact vias 128-A1 and 128-A2 with liner layer 129.

Comparing FIGS. 1A and 1C to FIGS. 7A and 7B, the semiconductor structure 500 includes contact via 528-A1 connected to respective gate regions 506 of two VTFETs instead of respective top source/drain regions 112 of two VTFETs. In other respects, the semiconductor structures 100 and 500 are the same or similar, and similar reference numerals (e.g., 528-A1, 528-A2, 528-B, 529, 530, 539 and 540) have been used to designate the same or similar elements. In addition, in some embodiments, the MOL contact via level is connected to gate regions and source/drain regions of multiple VTFETs or other and/or types of transistor devices.

In illustrative embodiments, the contact vias 128-A1/228-A1/328-A1/428-A1/528-A1 and 128-A2/228-A2/328-A2/428-A2/528-A2 may be respectively connected to different types of transistors (e.g., n-type and p-type transistors). For example, in a non-limiting illustrative embodiments, the contact via 128-A1 is connected to two top source/drain regions (e.g., top source/drain regions 112) of an n-type VTFET, while the contact via 128-A2 is connected to two top source/drain regions of an p-type VTFET or vice versa. In illustrative embodiments, the contact lines 128-B/228-B/328-B/428-B/528-B are cross-connected to the contact vias 128-A1/228-A1/328-A1/428-A1/528-A1 and 128-A2/228-A2/328-A2/428-A2/528-A2, and the BEOL contact vias 130/230/330/430/530 correspond to an output signal.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETS, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. An example integrated circuit includes one or more semiconductor devices with the above-described contact via and contact line configurations.

As noted above, illustrative embodiments correspond to methods for forming interconnect structures that reduce resistance and capacitance, wherein the structures are based on minimizing the number of via and line levels, along with illustrative apparatus, systems and devices formed using such methods. The interconnect structures of the illustrative embodiments are built using dual-damascene plus subtractive etching techniques to form via and line levels. Advantageously, the embodiments provide for significant improvements in performance due to low resistance and low capacitance structures.

The embodiments differ from conventional structures by advantageously reducing the number of via and line levels. Additionally, unlike current configurations, the embodiments reduce capacitance while maintaining long interface lengths and increased thickness for reduced resistance. For example, BEOL contact vias according to the embodiments have increased contact area with contact lines, resulting in less resistance.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a plurality of vertical transport field effect transistors; and
an interconnect structure connected to one of respective source/drain regions of at least two vertical transport field effect transistors of the plurality of vertical transport field effect transistors and respective gate regions of the at least two vertical transport field effect transistors, wherein the interconnect structure comprises:
a damascene portion; and
a subtractive portion disposed on a top surface of the damascene portion.

2. The semiconductor structure of claim 1, wherein the damascene portion and the subtractive portion comprise the same metal.

3. The semiconductor structure of claim 1, wherein the subtractive portion comprises a single metal layer.

4. The semiconductor structure of claim 3, wherein the damascene portion comprises a metal fill layer disposed on a liner layer.

5. The semiconductor structure of claim 4, wherein the metal fill layer comprises the same metal as the single metal layer.

6. The semiconductor structure of claim 1, wherein the damascene portion comprises at least one via, wherein the at least one via is connected to one of the respective source/drain regions and the respective gate regions of the at least two vertical transport field effect transistors.

7. The semiconductor structure of claim 1, wherein the damascene portion and the subtractive portion are continuous at one or more junctions between the damascene portion and the subtractive portion.

8. The semiconductor structure of claim 1, wherein the subtractive portion increases in width from a top of the subtractive portion to a bottom of the subtractive portion.

9. The semiconductor structure of claim 8, wherein the damascene portion decreases in width from a top of the damascene portion to a bottom of the damascene portion.

10. The semiconductor structure of claim 1, further comprising a via disposed through the subtractive portion.

11. The semiconductor structure of claim 1, further comprising a via disposed on a top surface of the subtractive portion and wrapping around sides of the subtractive portion.

12. The semiconductor structure of claim 1, further comprising a via disposed on a top surface of the subtractive portion and extending beyond edges of the subtractive portion.

13. The semiconductor structure of claim 1, wherein the respective source/drain regions comprise top source/drain regions of the at least two vertical transport field effect transistors.

14. The semiconductor structure of claim 1, wherein the respective source/drain regions comprise a first source/drain region having a first doping type and a second source/drain region having a second doping type different from the first doping type.

15. The semiconductor structure of claim 1, wherein:
a length of the damascene portion is at least three times a width of the damascene portion; and
a length of the subtractive portion is at least three times a width of the subtractive portion.

16. A semiconductor structure, comprising:
a plurality of vertical semiconductor channel regions;
a plurality of source/drain regions, wherein respective ones of the plurality of source/drain regions are disposed on top of respective ones the plurality of vertical semiconductor channel regions; and
an interconnect structure connected to the respective ones of the plurality of source/drain regions, wherein the interconnect structure comprises:
a damascene portion; and
a subtractive portion disposed on a top surface of the damascene portion.

17. The semiconductor structure of claim 16, wherein the subtractive portion increases in width from a top of the subtractive portion to a bottom of the subtractive portion.

18. The semiconductor structure of claim 16, further comprising a via disposed through the subtractive portion.

19. The semiconductor structure of claim 16, wherein the damascene portion comprises at least one via, wherein the at least one via is connected to one of the respective source/drain regions of the respective ones the plurality of vertical semiconductor channel regions.

20. The semiconductor structure of claim 16, wherein the damascene portion and the subtractive portion are continuous at one or more junctions between the damascene portion and the subtractive portion.

* * * * *